United States Patent [19]
Carloni et al.

[11] Patent Number: 5,821,782
[45] Date of Patent: Oct. 13, 1998

[54] FREQUENCY SYNTHESIS USING A REMODULATOR

[75] Inventors: Manuel J. Carloni, Holmdel; Leonard Joseph Cimini, Howell; Babak Daneshrad, Hackensack, all of N.J.

[73] Assignee: Lucent Technologies Inc., Murray Hill, N.J.

[21] Appl. No.: 872,477

[22] Filed: Jun. 9, 1997

Related U.S. Application Data

[63] Continuation of Ser. No. 574,003, Dec. 18, 1995, abandoned.

[51] Int. Cl.[6] .............................. H04L 27/30; H03L 7/16
[52] U.S. Cl. ........................ 327/105; 327/113; 327/551; 327/161; 327/153; 375/200
[58] Field of Search .................................. 327/100, 105, 327/113, 114, 116, 119, 129, 147, 156, 161, 153, 238, 254, 551, 270, 141; 375/200, 354

[56] References Cited

U.S. PATENT DOCUMENTS 5,235,612  8/1993  Stilwell et al. .............................. 375/1

*Primary Examiner*—Timothy P. Callahan
*Assistant Examiner*—Dinh Le

[57] ABSTRACT

Noise is input to a frequency generation circuit which includes a demodulator stage with a multiplier circuit in which the noise is multiplied by means of a feedback signal. The result of the multiplication in the demodulator stage is passed through a low pass filter. In a modulation wipe-off stage of the frequency generation circuit, the sign of the filtered multiplier output is extracted using a comparator circuit. The comparator circuit output is passed to a correlator circuit. In the correlator circuit, the comparator circuit output multiplies a delayed version of the input noise which is provided by a delay circuit element. The correlator circuit generates quadrature signals. Summation of the quadrature signals followed by bandpass filtering and amplitude limiting yields a discrete synthesized frequency signal.

8 Claims, 3 Drawing Sheets

FREQUENCY SYNTHESIS USING A REMODULATOR

This is a continuation of application Ser. No. 08/574,003, filed on Dec. 18, 1995 and now abandoned.

FIELD OF THE INVENTION

This invention relates to frequency synthesis and discrete frequency signal generation.

BACKGROUND OF THE INVENTION

Frequency synthesis is an important capability with numerous practical applications. Phase locked loop (PLL) circuits have been used previously for frequency synthesis. PLL arrangements often possess narrow bandwidths which result in long transient effects and relatively long acquisition time to achieve a desired generated frequency.

A phase-locked loop (PLL) system uses feedback to maintain an output signal in a specific phase relationship with a reference signal. PLLs are used in many areas of electronics to control the frequency and/or phase of a signal, such as in frequency synthesizers.

FIG. 1 shows a block diagram of a PLL system 20. The PLL system 20 includes a phase detector 22 to produce an output voltage proportional to the phase difference of two input signals. A loop filter 24 is a circuit that is used to control PLL dynamics and performance. The loop filter 24 is used to shape the overall response of the PLL to achieve design goals. A voltage controlled oscillator (VCO) 26 is a circuit that produces an ac output signal whose frequency is proportional to the input control voltage. A divide by N circuit 28 produces an output signal whose frequency is an integer (denoted by N) division of the input signal frequency.

An active lag circuit 30 implementation of the loop filter 24 is shown in FIG. 2. This active lag circuit 30 produces a PLL with a second-order response characteristic. The completed time response of a PLL with an active loop filter to a step in input phase is plotted in FIG. 3.

In frequency synthesizers using PLLs, the divider ratio (N) used in the feedback loop has the effect of multiplying any noise that appears at the input or output of the phase detector by this ratio. In certain cases, a large value of N may be required to achieve the desired output frequencies, which can cause excessive output noise.

Frequency synthesizers are widely used in radio communications equipment to obtain a stable frequency source. Shortcomings of a PLL frequency synthesizer include the required channel change time and output noise.

SUMMARY OF THE INVENTION

A remodulator circuit has been used for carrier signal recovery from an IF signal input in a coherent receiver. Such a circuit provides fast carrier acquisition in coherent detection operation. In accordance with the principles of the invention, it has been discovered that rapid acquisition frequency synthesis, and frequency generation with fast settling time, can be obtained using the remodulator approach.

An illustrative embodiment of the present invention provides a new technique for frequency synthesis and generation based on a remodulator frequency generation circuit. The frequency generator circuit is capable of generating a pre-selected frequency based on a delay value when excited with noise. The frequency generation circuit comprises a demodulator stage, a modulation wipe-off stage, and a delay circuit component.

The demodulator stage comprises two mixers for multiplying an input signal by its quadrature components, which are passed back from the frequency generation circuit output. The first and second mixers in the demodulator stage are operable to generate first and second multiplier signals, respectively. The demodulator stage includes a first low pass filter for filtering the first multiplier signal and a second low pass filter for filtering the second multiplier signal. The filtered first and second multiplier signals are each passed to the modulation wipe-off stage.

In the modulation wipe-off stage, the sign of the first filtered multiplier signal is extracted using a first comparator circuit or other means. The comparator circuit compares the first filtered multiplier signal to a zero reference. If the first filtered multiplier signal is determined to be positive, then a plus one (+1) is output by the first comparator (e.g., by a 5 Volt output). If the first filtered multiplier signal is determined to be negative, then the first comparator outputs a negative one (−1) value (e.g., by a −5 Volts output). The sign of the second filtered multiplier signal is similarly extracted using a second comparator circuit. If the second filtered multiplier signal is determined to be positive, a plus one sign value is generated, and if the second filtered multiplier signal is determined to be negative, a minus one sign value is generated.

The output of the delay circuit is passed forward to multiply each of the first and second comparator signals in a quadrature mixer circuit in the modulation wipe-off stage. The quadrature mixer circuit operates to generate first and second quadrature signals in response to the extracted sign embodied in the first and second comparator signals, respectively. An adder component adds the first and second quadrature signals to generate an amplitude modulated continuous sinusoid having a desired frequency.

The amplitude modulated continuous sinusoid from the modulation wipe-off stage is passed to a bandpass filter. The output of the bandpass filter is passed to an envelope limiter, which functions to remove amplitude variations. The output of the envelope limiter presents the desired synthesized frequency signal.

The synthesized frequency signal is fed back for multiplying the input noise at the mixers in the multiplier circuit in the demodulator stage. The delay circuit component may be controlled to adjust the frequency of the synthesized signal.

In operation, the frequency generation circuit is excited at its input using a noise source. The delay circuit component is controlled to vary the delay of the input noise such that a desired frequency is quickly generated at the output of the envelope limiter with little settling time.

Other features and advantages of the invention will become apparent from the following detailed description, taken in conjunction with the accompanying drawing, which illustrates the principles of the invention by way of example.

DETAILED DESCRIPTION

A preferred embodiment of the invention can be used as an adjustable frequency synthesizer providing fast acquisition time for a noise input. A frequency generating circuit according to the principles of the invention enables a shorter acquisition time to generate a particular frequency compared to other frequency synthesizers, such as phase locked loop (PLL) circuits.

The frequency generating circuit according to the preferred embodiment of the invention utilizes a remodulator circuit to generate a discrete frequency from noise. In the frequency generating circuit, a noise input is passed through a demodulator stage which includes a multiplier circuit. The output of the multiplier circuit is filtered in a narrowband low pass filter in the demodulator stage to remove unwanted components of mixing operations.

The low pass filter output is passed to a modulation wipe-off stage. The modulation wipe-off stage includes a comparator circuit to remove sign changes in the modulating signal of the desired frequency component. The output of the comparator circuit is a +1 sign value or a −1 sign value (e.g., 5 Volts or −5 Volts) comparator signal. The comparator output signal is mixed (correlated) with a delayed version of the input noise in a correlation circuit to generate a correlation signal. The correlation output signal is passed to a bandpass filter and then passed to an envelope limiter to remove amplitude variations in the recovered tone. The output tone of the envelope limiter presents the generated frequency signal. A delay circuit element receives and delays the noise input. The tone generated by the frequency generating circuit has a frequency responsive to adjustment of the delay element.

Figure 1:
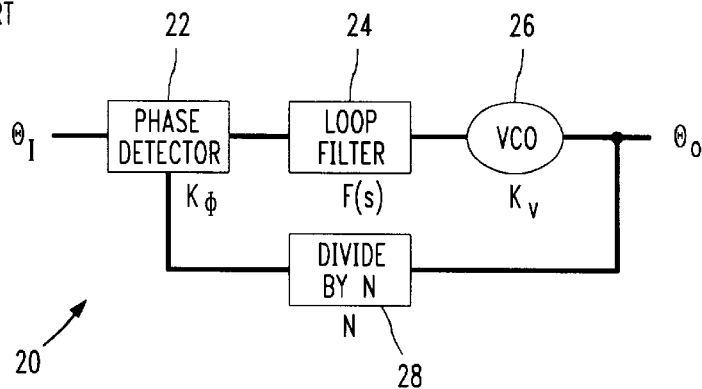
FIG. 1 shows a block diagram representation of a PLL system.
Figure 2:
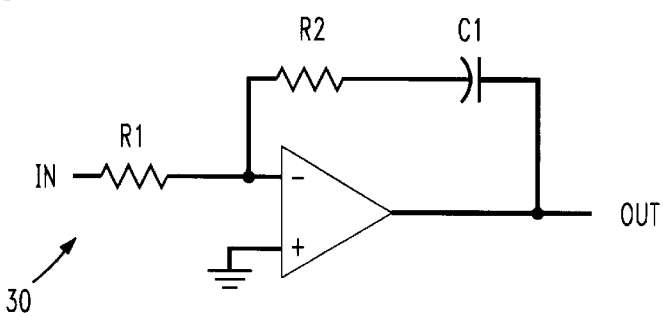
FIG. 2 shows a representation of an active loop filter circuit for the PLL system depicted in FIG. 1.
Figure 3:
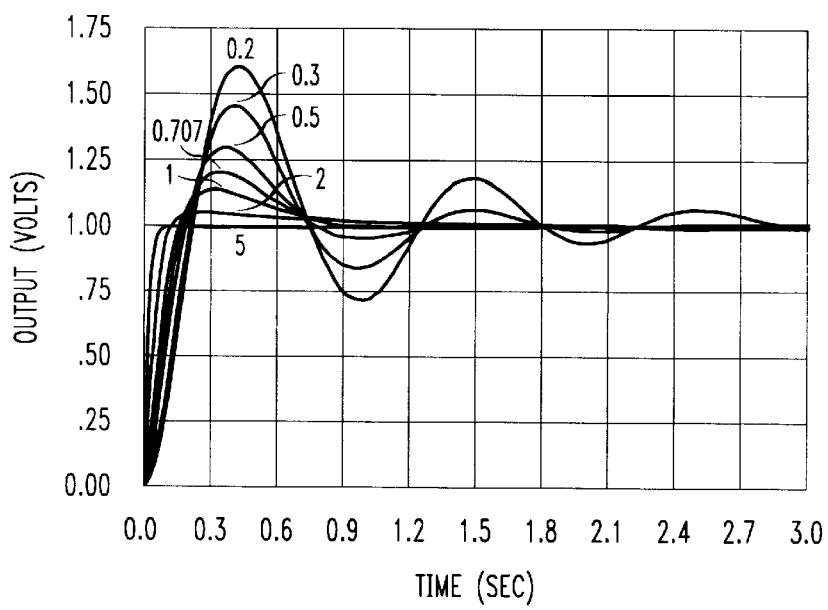
FIG. 3 shows closed-loop PLL response for various damping factors.
Figure 4:
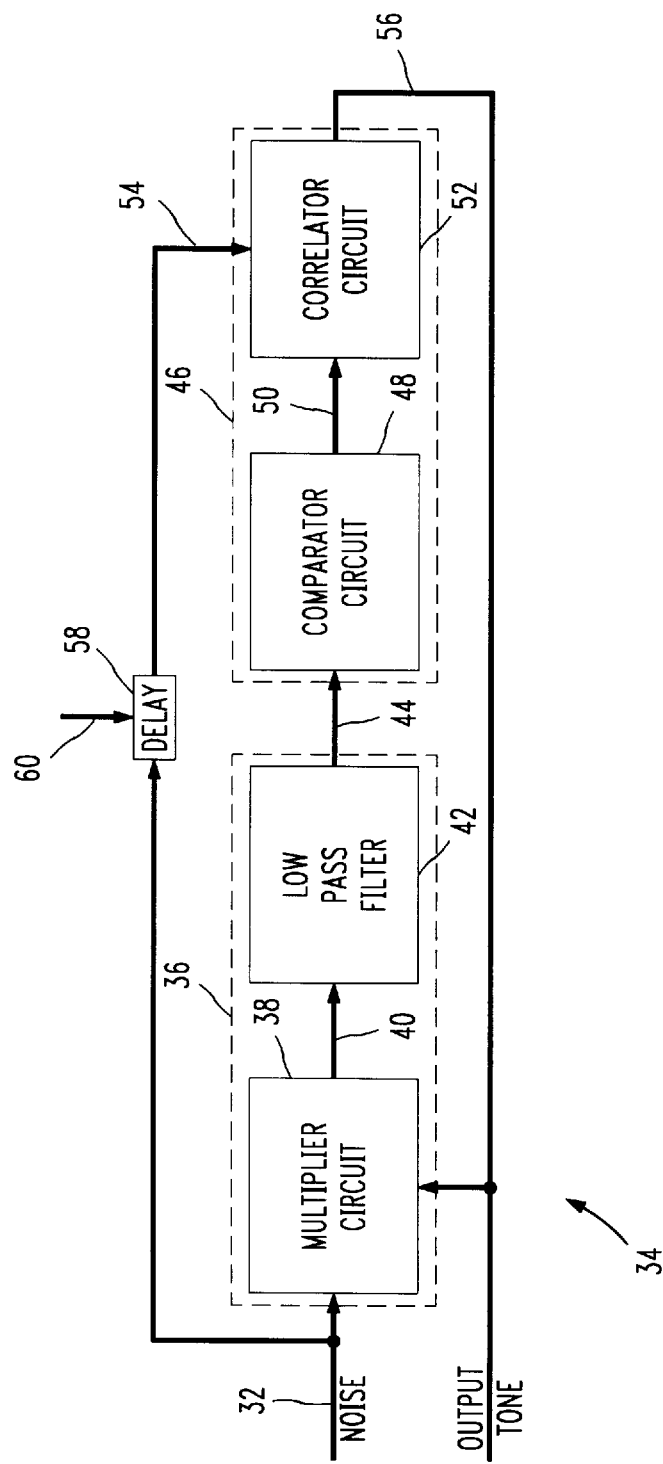
FIG. 4 shows a simplified representation of a frequency generation circuit in accordance with the principles of the invention.

Referring to FIG. 4, noise 32 is received by the frequency generating circuit 34 for generating the desired frequency signal. The received noise 32 is passed through a demodulator stage 36 including a multiplier circuit 38. The multiplier circuit 38 is responsive to generate a multiplier signal 40. The multiplier signal 40 is passed to a narrowband low pass filter 42 in the demodulator stage 36. The narrowband low pass filter 42 operates to filter the multiplier signal 40 and to generate a filtered multiplier signal 44. The filtered multiplier signal 44 is input to a modulation wipe-off stage 46.

Modulation wipe off stage 46 includes a comparator circuit 48 which operates to extract the sign of the filtered multiplier signal 44 as compared to a zero reference value. The comparator circuit 48 compares the filtered multiplier signal 44 to zero to generate a comparator signal 50. If the filtered multiplier signal 44 is greater than zero, then the generated comparator signal 50 has a value of plus one (+1) which can be represented by a positive voltage. If the filtered multiplier signal 44 is less than zero, then the generated comparator signal 50 has a value of minus one (−1) which can be represented by a negative voltage. The generated comparator signal 50 is passed to a correlator circuit 52 in the modulation wipe-off stage 46, wherein the comparator signal 50 is correlated with a delayed noise 54 in order to remove phase discontinuities in the desired carrier. The correlator circuit 52 generates a synthesized frequency signal 56. The synthesized frequency signal 56 is fed back for input to the multiplier circuit 38 in the demodulator stage 36. A delay circuit component 58 receives the noise 32 and generates the delayed noise 54. The delayed noise 54 is fed to the correlator circuit 52. The delay circuit element 58 is controllable 60 to adjust the amount of delay provided to select the synthesized tone generated.

Figure 5:
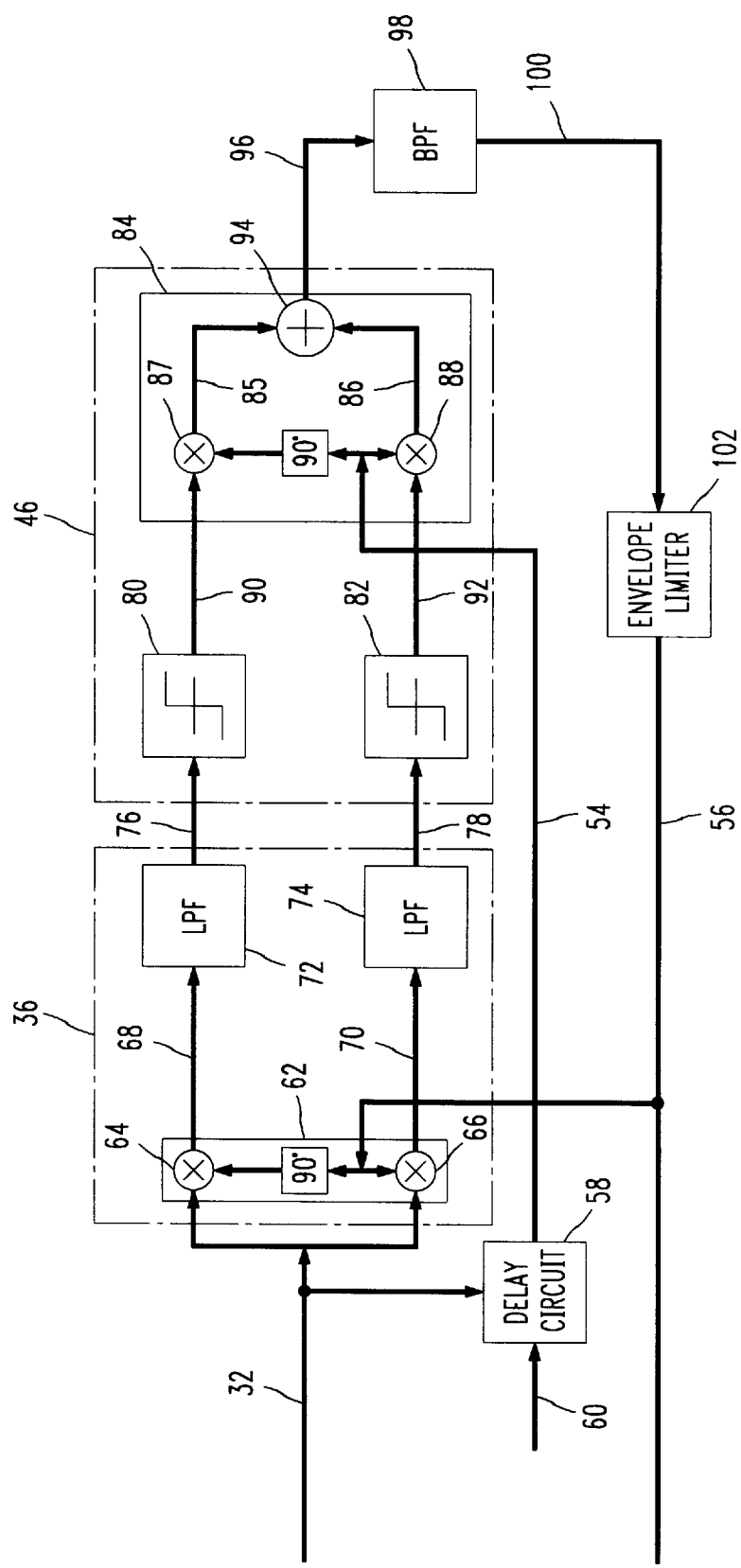
FIG. 5 shows a detailed representation of a frequency generation circuit in accordance with the principles of the invention.

Referring to FIG. 5, the preferred embodiment of the present invention enables frequency synthesis and generation of a preselected frequency responsive to the amount of delay caused by the delay circuit. The frequency generating circuit is excited with noise 32. The delay circuit component 58 also receives input noise 32. The demodulator stage 36 comprises a multiplier circuit 62 including two mixers 64, 66 for demodulating the input noise 32. Each mixer 64, 66 multiplies the input noise 32 with a feedback synthesized frequency signal. The first and second mixers 64, 66 in the demodulator stage 36 are operable to generate first and second multiplier signals 68, 70, respectively. The demodulator stage 36 includes a first low pass filter 72 for filtering the first multiplier signal 68 and a second low pass filter 74 for filtering the second multiplier signal 70. The filtered first and second multiplier signals 76, 78 are each passed to modulation wipe-off stage 46.

In modulation wipe-off stage 46, a sign value (positive or negative) of the first filtered multiplier signal 76 is extracted using a first comparator 80. This is accomplished by comparing the first multiplier signal 76 to zero. A second comparator 82 is used to extract a sign value (positive or negative) of the second multiplier signal 78 by comparing the second multiplier signal 78 to zero. The sign value of the first filtered multiplier signal 76 is embodied in a first comparator signal 90 generated by the first comparator 80. The sign value of the second filtered multiplier signal 78 is embodied in a second comparator signal 92 generated by the second comparator 82. The first comparator signal 90 and the second comparator signal 92 are passed to a correlator circuit 84.

The correlator circuit 84 includes a first quadrature mixer 87 and a second quadrature mixer 88 for mixing (correlating) the feed forward delay circuit output 54 with the first and second comparator signals 90, 92 to generate first and second quadrature signals 85, 86. The correlation circuit 84 includes a summation component 94 for summing the first and second quadrature signals 85, 86 to generate a correlator signal 96.

The correlator signal 96 is passed from the modulation wipe-off stage 46 to a bandpass filter 98. The output 100 of the bandpass filter 98 is passed to an envelope limiter 102 to remove amplitude variations in the output 100 of the bandpass filter 98. The output of the envelope limiter 102 presents the desired synthesized frequency signal 56. The synthesized frequency signal 56 is passed back for multiplication by the mixers 64, 66 in the multiplier circuit 62 of the demodulator stage 36. The delay circuit component 58 is controllable 60 to adjustably change the frequency of the modulating frequency in correlator signal 96.

In operation, the electronic frequency generation circuit is excited at its input with noise. The delay circuit component 58 is controlled 60 to vary the delay of the input noise 32 such that a desired frequency is quickly acquired at the output 56 of the envelope limiter 102.

It will be appreciated that (a) a frequency generation circuit in accordance with the principles of the invention has a faster transient response than a PLL frequency synthesizer; and, (b) the transition time from an initial state at the start of a burst to a steady state suitable for application is shorter.

The foregoing merely illustrates the principles of the invention. It will thus be appreciated that those skilled in the art will be able to devise various arrangements which, although not explicitly described or shown herein, embody the principles of the invention and are thus within its scope and spirit.

We claim:

1. A method of frequency synthesis, comprising the steps of:

providing noise to a multiplier circuit to generate a multiplier circuit output signal;

low pass filtering the multiplier circuit output signal using one or more low pass filters to generate a filtered multiplier circuit output signal;

providing the filtered multiplier circuit output signal to a comparator circuit which compares the multiplier circuit output signal to a threshold voltage to generate a comparator circuit output signal;

providing the comparator circuit output signal to a correlator circuit to generate a synthesized frequency signal;

feeding the synthesized frequency signal back to the multiplier circuit; and providing the noise that was provided to the multiplier circuit to the correlator circuit, delaying the noise before providing the noise to the correlator circuit, and varying the delay such that the synthesized frequency signal quickly acquires a desired frequency.

2. A method according to claim 1, further comprising the step of:

bandpass filtering the synthesized frequency signal.

3. A method according to claim 1, further comprising the step of:

limiting the synthesized frequency signal using an envelope limiter.

4. A method of synthesizing a frequency from noise, comprising the steps of:

providing noise to a multiplier circuit to generate first and second multiplier circuit output signals based on a synthesized frequency signal;

filtering the first and second multiplier circuit output signals to generate first and second filtered multiplier circuit output signals;

using first and second comparator circuits which are each operative to compare a filtered multiplier circuit output signal to a threshold voltage, generating first and second comparator circuit output signals based on the first and second filtered multiplier circuit output signals;

using a correlator circuit, generating a correlator circuit output signal based on the first and second comparator circuit output signals;

bandpass filtering the correlator circuit output signal; and limiting the correlator circuit output signal using an envelope limiter to generate the synthesized frequency signal, delaying the noise that was provided to the multiplier circuit to generate delayed noise, providing the delayed noise to the correlator circuit, wherein the correlator circuit output signal is based on the delayed noise, and varying the delay such that a desired synthesized frequency is quickly acquired.

5. A method according to claim 4, further comprising the steps of:

generating first and second quadrature signals based on the first and second comparator circuit output signals, and adding the first and second quadrature signals to generate the correlator circuit output signal.

6. A frequency generation circuit for generating a synthesized frequency signal, comprising:

a multiplier circuit for receiving an input signal and generating a multiplier circuit output signal based on the input signal and a synthesized frequency signal;

a low pass filter for filtering the multiplier circuit output signal and generating a filtered multiplier circuit output signal;

a comparator circuit for comparing the filtered multiplier circuit output signal to a threshold voltage and generating a comparator circuit output signal based on the filtered multiplier circuit output signal;

a delay circuit for delaying the input signal and generating a delayed input signal; and a correlator circuit for correlating the comparator circuit output signal and the delayed input signal to generate the synthesized frequency signal; wherein the delay circuit is controlled to vary the delay such that the synthesized frequency signal quickly acquires a desired frequency.

7. A circuit according to claim 6, wherein:

the low pass filter is a narrow band filter.

8. A circuit according to claim 6, wherein:

the correlator circuit is coupled to the multiplier circuit.

* * * * *